United States Patent
Shiratake et al.

(10) Patent No.: US 6,980,460 B2
(45) Date of Patent: Dec. 27, 2005

(54) SEMICONDUCTOR INTEGRATED CIRCUIT DEVICE AND OPERATION METHOD THEREFOR

(75) Inventors: Shinichiro Shiratake, Yokohama (JP); Ryu Ogiwara, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/803,935

(22) Filed: Mar. 19, 2004

(65) Prior Publication Data
US 2005/0057956 A1    Mar. 17, 2005

(30) Foreign Application Priority Data
Sep. 12, 2003 (JP) .............................. 2003-321130

(51) Int. Cl.⁷ ............................................. G11C 11/22
(52) U.S. Cl. ........................................ 365/145; 365/65
(58) Field of Search ............................... 365/145, 196, 365/204, 149

(56) References Cited

U.S. PATENT DOCUMENTS

| | | | |
|---|---|---|---|
| 6,094,370 A * | 7/2000 | Takashima | .................. 365/145 |
| 6,473,330 B1 | 10/2002 | Ogiwara et al. | |
| 6,493,251 B2 | 12/2002 | Hoya et al. | |
| 6,522,569 B2 * | 2/2003 | Miyakawa et al. | ......... 365/145 |
| 6,549,449 B2 * | 4/2003 | Takashima | .................. 365/149 |
| 6,552,922 B2 | 4/2003 | Ogiwara et al. | |
| 6,643,163 B2 * | 11/2003 | Takashima | .................. 365/145 |
| 6,671,200 B2 | 12/2003 | Ogiwara et al. | |

FOREIGN PATENT DOCUMENTS

JP    2000-339973    12/2000

* cited by examiner

*Primary Examiner*—Thong Q. Le
(74) *Attorney, Agent, or Firm*—Oblon, Spivak, McClelland, Maier & Neustadt, P.C.

(57) ABSTRACT

A semiconductor integrated circuit device includes first and second bit lines (BLs), first and second plate lines (PLs), a first series connected TC unit type structure connected between the first BL and the first PL, a second series connected TC unit type structure connected between the second BL and the second PL, a PL potential control circuit, and a BL potential control circuit. The PL potential control circuit controls a potential of the first PL from a first potential to a second potential and a potential of the second PL from the first potential to a third potential, when the first series connected TC unit type structure is selected. The BL potential control circuit controls a potential of the second BL to the third potential, after charges are transferred from the first series connected TC unit type structure to the first BL.

18 Claims, 12 Drawing Sheets

FIG. 5
Plate-line potential control circuit

FIG. 9  Short time from active to restore

Long time from active to restore

FIG. 10

Short cycle

FIG. 11

Long cycle

SEMICONDUCTOR INTEGRATED CIRCUIT DEVICE AND OPERATION METHOD THEREFOR

CROSS-REFERENCE TO RELATED APPLICATIONS

This application is based upon and claims the benefit of priority from the prior Japanese Patent Application No. 2003-321130, filed Sep. 12, 2003, the entire contents of which are incorporated herein by reference.

BACKGROUND OF THE INVENTION

1. Field of the Invention

The present invention relates to a semiconductor integrated circuit device and, more particularly, to suppression of data destruction in a semiconductor integrated circuit device having a ferroelectric memory.

2. Description of the Related Art

A ferroelectric capacitor changes in polarization state by applying a voltage across the capacitor. A ferroelectric memory is a memory which reads out, as a signal, charges emitted from a ferroelectric capacitor when a predetermined voltage is applied to the capacitor to change its polarization state. For example, when a positive voltage is applied to a ferroelectric which stores a negative signal, the polarization is inverted to read out many charges from the capacitor. The polarization state does not change unless a voltage is applied to the capacitor. If an unexpected voltage is applied to the ferroelectric capacitor due to noise or the like, data is destroyed. In the ferroelectric memory, application of voltage noise to a memory cell capacitor which is not accessed must be prevented as much as possible.

Figure 19:
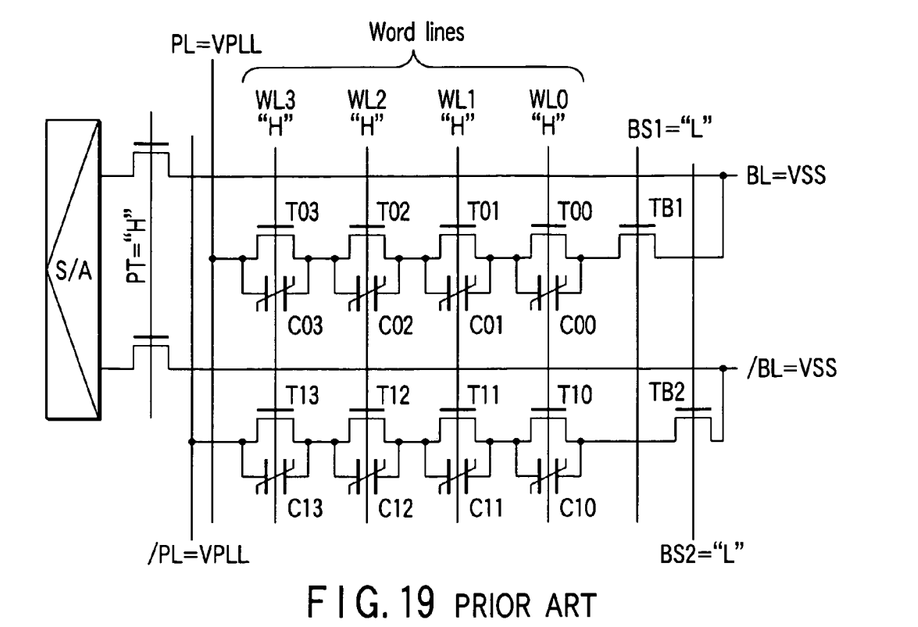
FIG. 19 is a circuit diagram showing an example of a ferroelectric memory (standby state)

FIG. 19 shows an example of a ferroelectric memory.

This ferroelectric memory is a memory which includes series connected memory cells each having a transistor having a source terminal and a drain terminal and a ferroelectric capacitor inbetween the two terminals, hereafter named "Series connected TC unit type ferroelectric RAM".

In the series connected TC unit type ferroelectric RAM, all word lines WL0 to WL3 are fixed to a "HIGH" potential in the standby state, and the two terminals of the ferroelectric capacitor are short-circuited. This completely suppresses application of a voltage to the memory cell capacitor in the standby state.

Figure 20:
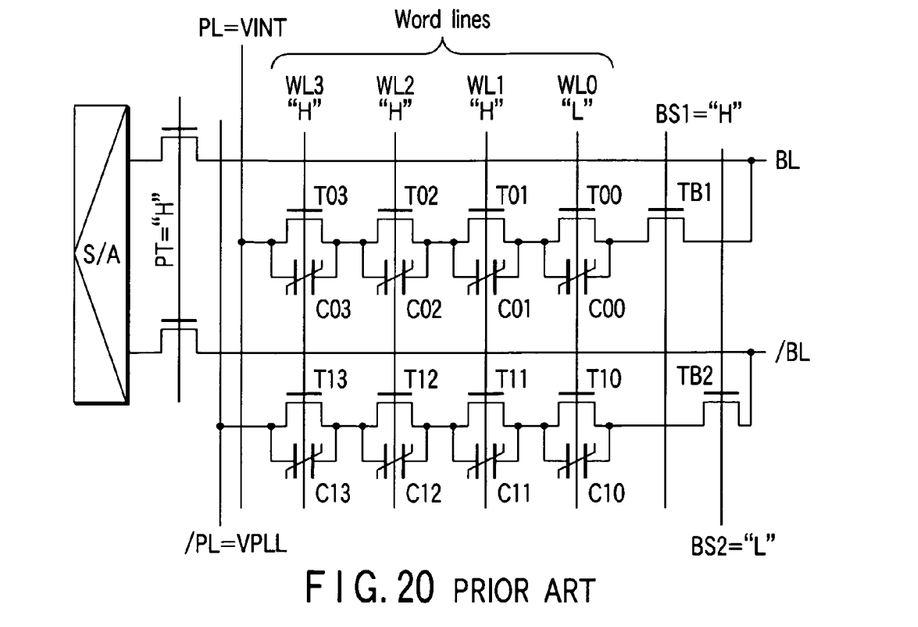
FIG. 20 is a circuit diagram showing another example of the ferroelectric memory (active state)

FIG. 20 shows an active state in which one of series-connected memory cells is accessed. In FIG. 20, the word line WL0 is selected to hold WL0="LOW" level. Further, a block selection line BS1 is activated to BS1="HIGH" level. The potential of a plate line PL is fixed to PL=VPLL in the standby state. When a memory cell is accessed, the plate line PL changes to PL=VINT and is activated. In this case, VPLL is typically 0V, and VINT is 2.5V. Since the word line WL0="LOW" level, a transistor T00 is turned off, a voltage is applied across a memory cell capacitor C00, and charges corresponding to the held data are transferred to a bit line BL. Another plate line /PL is not activated and maintains /PL=VPLL. A block selection line BS2 also maintains BS2="LOW" level. No data is transferred to a bit line /BL adjacent to the bit line BL, and the bit line /BL is used as a complementary bit line.

Figure 21:
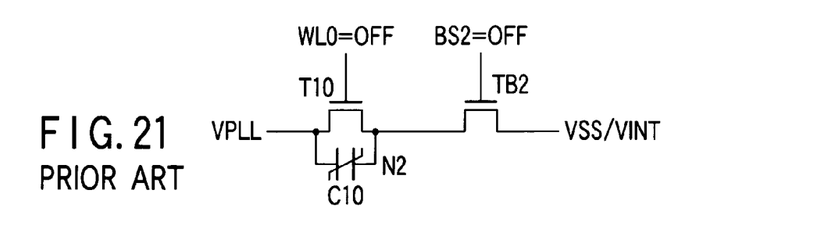
FIG. 21 is a circuit diagram showing the potential relationship of the capacitor of an unselected memory cell.

Attention is given to an unselected memory cell C10. The unselected plate line /PL is inactive and thus fixed to the potential VPLL. The block selection line BS2 is also inactive, and C10 has a node connection relationship shown in FIG. 21. More specifically, one terminal of the capacitor C10 is connected to the inactive plate line /PL=VPLL, and the other terminal of the capacitor C10 is connected to a floating node N2 between two "OFF" transistors T10 and TB2 having a "LOW"-level gate potential. The potential of the bit line /BL is amplified to VSS (=0V) or VINT in accordance with data of a memory cell selected by a sense amplifier. Assume that /BL=VINT. The "OFF" transistor TB2 has a potential difference between its source and drain. Even if the gate potential of the transistor TB2 is set at "LOW" level and it is OFF, a current is not cut off by an infinite resistance value, and a finite subthreshold current flows through its source-drain path. Since the node N2 is floating, the subthreshold current changes the potential of the node N2. If the chip activation time is prolonged, the potential of the node N2 may change by, e.g., 100 mV or more. When this happens, a voltage is applied to the capacitor C10, destroying data.

To prevent this, a method of discharging the potential of a bit line to 0V at once regardless of data in a memory cell has been proposed (see, e.g., reference 1). According to this method, in FIG. 21, potentials on the other-terminal sides of the source-drain paths of the two transistors which sandwich the floating node N2 are the potential VPLL and a discharge bit line potential of 0V. The above problem does not occur at VPLL=0V.

Further, a method of setting the standby voltage VPLL of a plate line to a value other than 0V has also been proposed (see, e.g., reference 2). It is difficult to activate the chip for a long time for such ferroelectric memory.

reference 1: Jpn. Pat. Appln. KOKAI Publication No. 2000-339973 reference 2: U.S. Pat. No. 6,493,251

BRIEF SUMMARY OF THE INVENTION

A semiconductor integrated circuit device according to a first aspect of the present invention comprises a series connected TC unit type ferroelectric RAM which includes series connected memory cells each having a transistor having a source terminal and a drain terminal and a ferroelectric capacitor inbetween the two terminals, the device comprising: first and second bit lines; first and second plate lines; a first series connected TC unit type structure which includes series connected memory cells, and has one terminal connected to the first bit line via a first selection transistor and the other terminal connected to the first plate line; a second series connected TC unit type structure which includes series connected memory cells, and has one terminal connected to the second bit line via a second selection transistor and the other terminal connected to the second plate line; word lines connected to gates of the series connected memory cells included in the first series connected TC unit type structure and gates of the series connected memory cells included in the second series connected TC unit type structure; a plate line potential control circuit which controls, in a standby state, potentials of the first and second plate lines to a first potential and, in an active state, the potential of the first plate line from the first potential to a second potential and the potential of the second plate line from the first potential to a third potential when one of the series connected memory cells included in the first series connected TC unit type structure is selected; and a bit line potential control circuit which controls a potential of the second bit line to the third potential, after charges are transferred from one of the ferroelectric capacitor included in the first series connected TC unit type structure to the first bit line.

An operation method for a semiconductor integrated circuit device according to a second aspect of the present invention comprises a series connected TC unit type ferroelectric RAM which includes series connected memory cells each having a transistor having a source terminal and a drain terminal and a ferroelectric capacitor inbetween the two terminals, the device comprises, first and second bit lines, first and second plate lines, a first series connected TC unit type structure which includes series connected memory cells, and has one terminal connected to the first bit line via a first selection transistor and the other terminal connected to the first plate line, a second series connected TC unit type structure which includes series connected memory cells, and has one terminal connected to the second bit line via a second selection transistor and the other terminal connected to the second plate line, and word lines connected to gates of the series connected memory cells included in the first series connected TC unit type structure and gates of the series connected memory cells included in the second series connected TC unit type structure, the operation method comprising: controlling, in a standby state, potentials of the first and second plate lines to a first potential; controlling, in an active state, the potential of the first plate line from the first potential to a second potential and the potential of the second plate line from the first potential to a third potential when one of the series connected memory cells included in the first series connected TC unit type structure is selected; and controlling a potential of the second bit line to the third potential, after charges are transferred from one of the ferroelectric capacitor included in the first series connected TC unit type structure to the first bit line.

DETAILED DESCRIPTION OF THE INVENTION

Embodiments of the present invention will be described below with reference to the several views of the accompanying drawing. In the following description, the same reference numerals denote the same parts throughout the drawing.

(First Embodiment)

Figure 1:
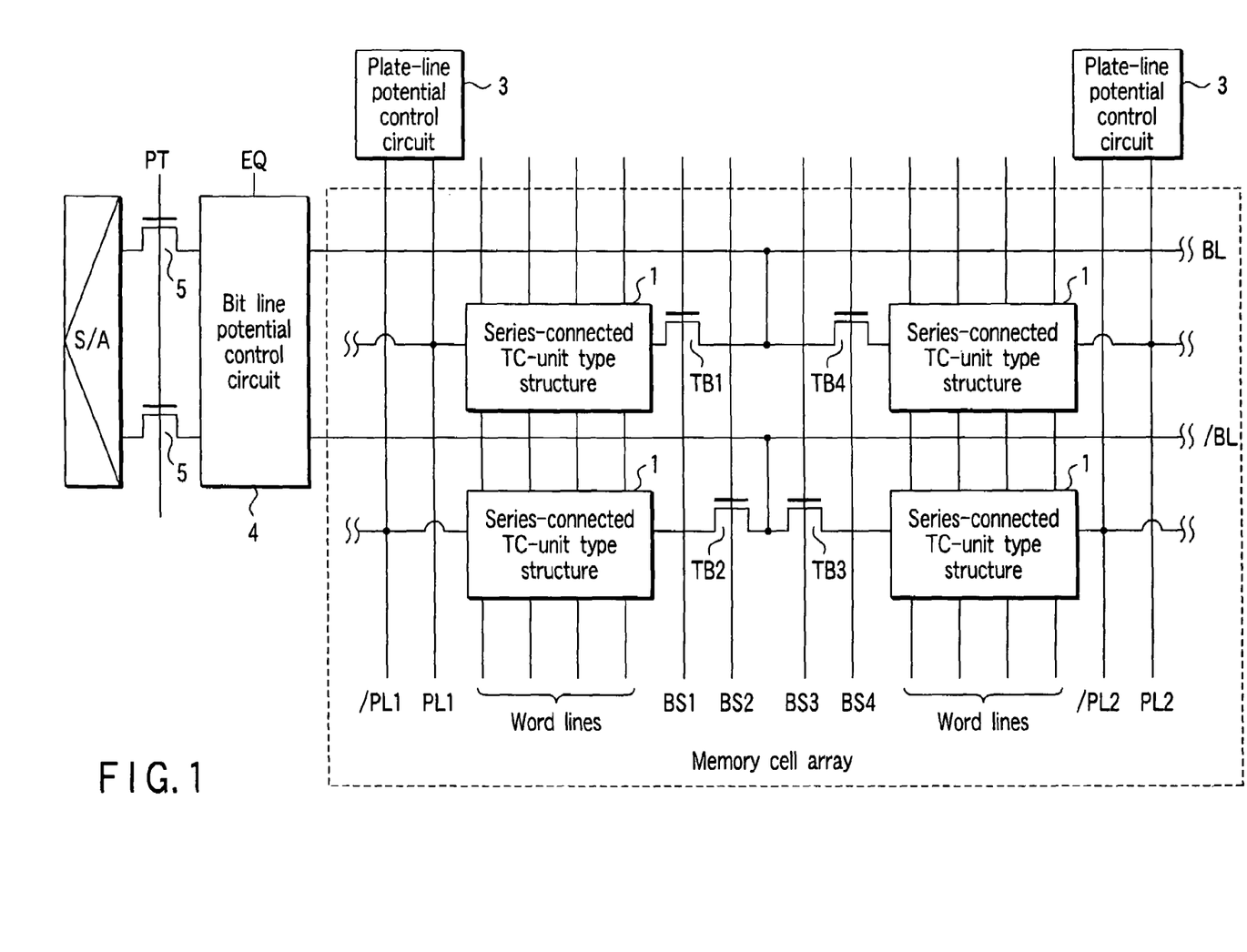
FIG. 1 is a block diagram showing an arrangement example of a semiconductor integrated circuit device according to the first embodiment of the present invention.
Figure 2:
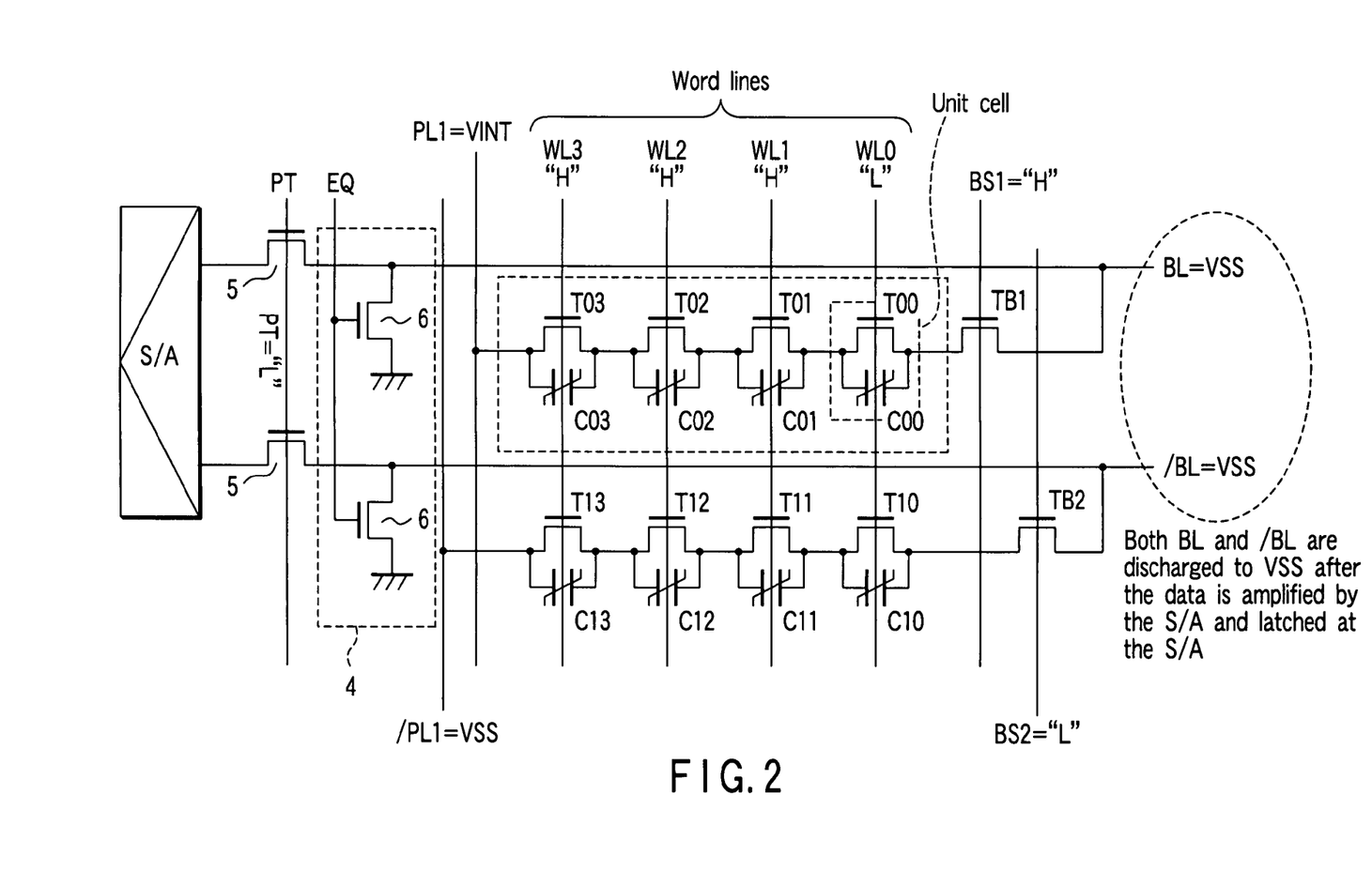
FIG. 2 is a circuit diagram showing a circuit example of the semiconductor integrated circuit device according to the first embodiment of the present invention.
Figure 3:
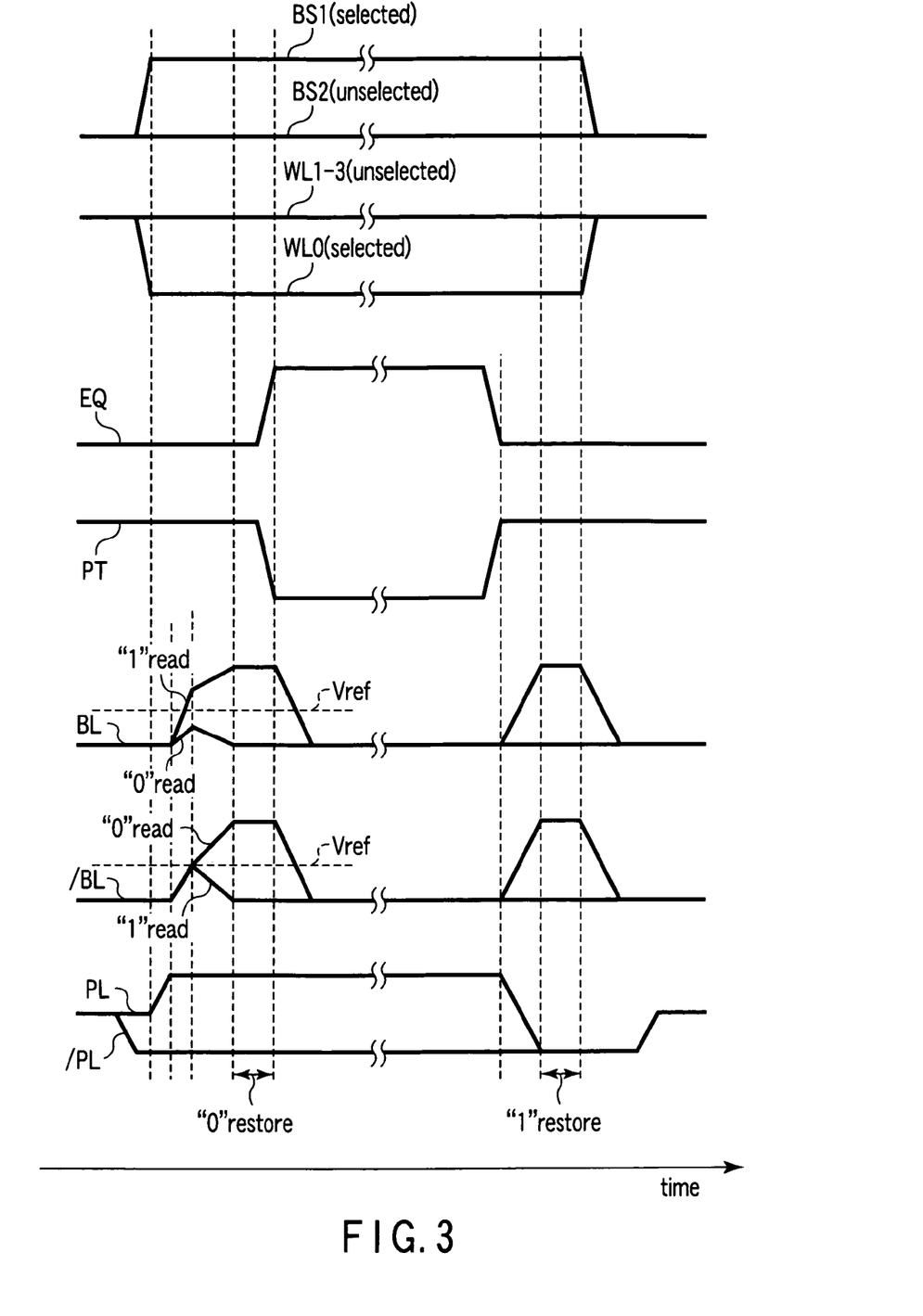
FIG. 3 is an operation waveform chart showing an operation example of the semiconductor integrated circuit device according to the first embodiment of the present invention.

FIG. 1 is a block diagram showing an arrangement example of a semiconductor integrated circuit device according to the first embodiment of the present invention. FIG. 2 is a circuit diagram showing a circuit example of the semiconductor integrated circuit device. FIG. 3 is an operation waveform chart showing an operation example of the semiconductor integrated circuit device.

As shown in FIGS. 1 and 2, a semiconductor integrated circuit device according to the first embodiment has a "series connected TC unit type ferroelectric RAM" in which the two terminals of a capacitor (C) are respectively connected to the source and drain of a cell transistor (T) to constitute a unit cell, and a plurality of unit cells are series-connected.

A series connected TC unit type structure 1 includes a plurality of series-connected unit cells. One terminal of the series connected TC unit type structure 1 is connected to a bit line BL (or /BL) via a selection transistor TB, and the other terminal of the structure 1 is connected to a plate line PL (or /PL).

A plate line potential is supplied to the plate lines PL and /PL, and controlled by a corresponding plate line potential control circuit 3. Similarly, a bit line potential is supplied to the bit lines BL and /BL, and controlled by a bit line potential control circuit 4. In this example, as shown in FIG. 2, the potential of the plate line /PL connected to a ferroelectric capacitor C10 in an unselected memory cell connected to a selected word line WL0 is discharged not to VPLL, but to VSS, e.g., 0V. Although not shown in FIG. 2, the potentials of plate lines PL2 and /PL2 connected to a memory cell not connected to a selected word line stay at, e.g., VPLL.

After data of a ferroelectric capacitor C00 in an accessed memory cell is transferred to the bit line BL and amplified by a sense amplifier S/A, the potentials of the bit line BL and complementary bit line /BL are discharged to VSS (e.g., 0V). A transistor 5 which connects the bit line BL, complementary bit line /BL, and sense amplifier S/A is turned off by a control signal PT to latch data by the sense amplifier S/A. The potentials of the bit line BL and complementary bit line /BL are discharged to VSS by using a transistor controlled by a bit line potential control circuit control signal EQ.

Figure 4:
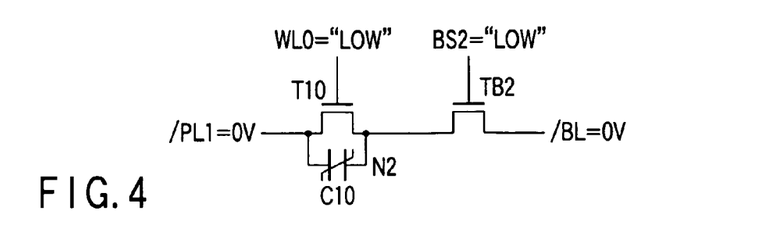
FIG. 4 is a circuit diagram showing the potential relationship of the capacitor of an unselected memory cell.

FIG. 4 shows the potential relationship of the capacitor C10 of an unselected memory cell. One terminal of the capacitor C10 is connected to the inactive plate line /PL1, and the plate line /PL1 is discharged to 0V (VSS) in the first embodiment. The other terminal of the capacitor C10 is connected to a node N2. The node N2 is set between transistors T10 and TB2. The node N2 electrically floats when the gate potentials of the transistors T10 and TB2 are set at "LOW" level and these transistors T10 and TB2 are OFF. In the first embodiment, the potential of the bit line /BL is discharged to 0V. Even if a subthreshold leakage current flows through the transistor TB2, the potential of the floating node N2 merely changes to 0V. That is, 0V is applied across the capacitor C10, and substantially no voltage is applied to the capacitor C10. Hence, data destruction by long-time activation of a chip hardly occurs in the capacitor C10 of an unselected memory cell.

In the first embodiment, data "0" is restored when, for example, the potentials of the bit line BL and plate line PL change to VSS and VINT, respectively. In the first embodiment, when data "0" is read out and the potential of the bit line BL drops to VSS, data "0" is restored.

Data "1" is restored when, for example, the potentials of the bit line BL and plate line PL change to VINT and VSS, respectively. In the first embodiment, to restore data "1", the control signal EQ is inactivated again, the control signal PT is activated again, and the bit line BL and sense amplifier S/A are connected to each other. When data "1" is read out, it is transferred again to the bit line BL. In this state, the potential of the plate line PL is decreased from VINT to VSS. As a result, data "1" is restored.

Figure 5:
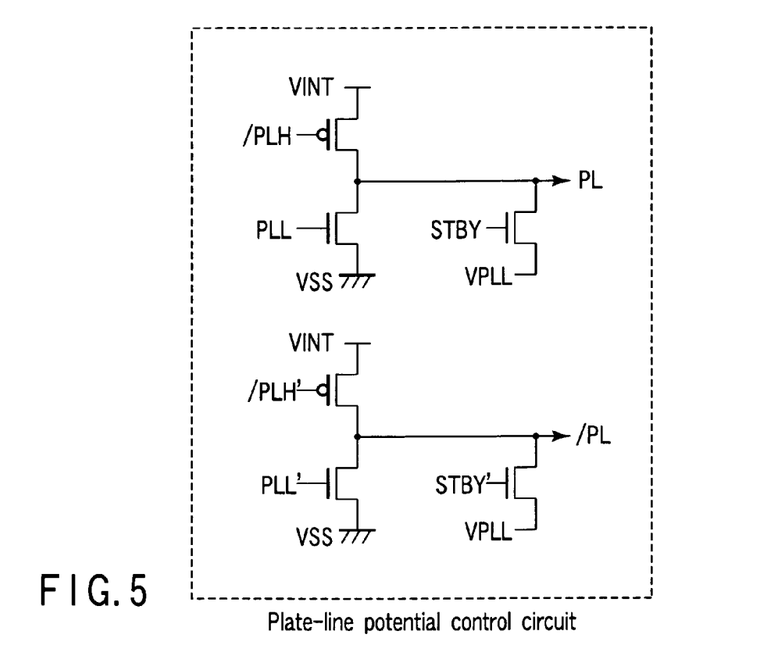
FIG. 5 is a circuit diagram showing a circuit example of a plate line potential control circuit.
Figure 6:
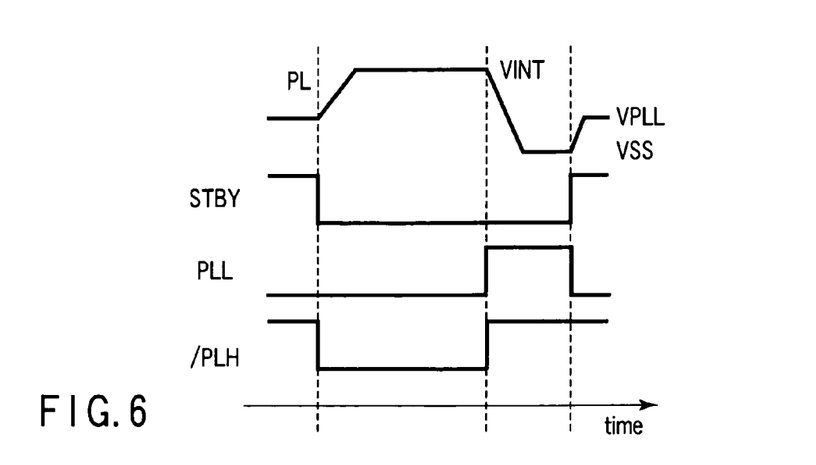
FIG. 6 is an operation waveform chart showing an operation example of the plate line potential control circuit.
Figure 7:
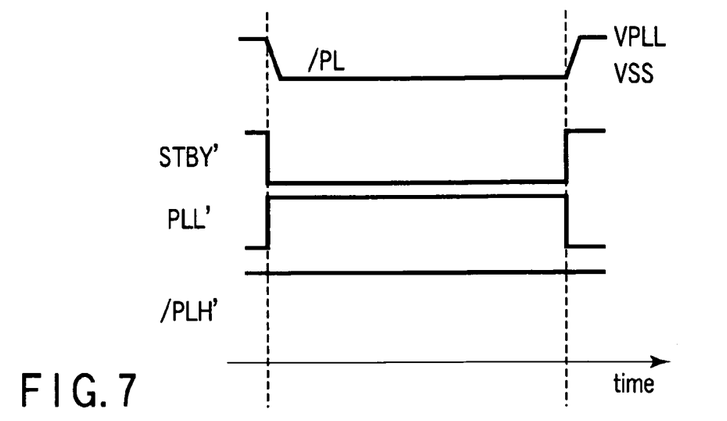
FIG. 7 is an operation waveform chart showing the operation example of the plate line potential control circuit.

FIG. 5 is a circuit diagram showing a circuit example of the plate line potential control circuit 3 which controls the potential of the plate line PL. FIGS. 6 and 7 are operation waveform charts showing an operation example of the plate line potential control circuit 3.

In the semiconductor integrated circuit device according to the first embodiment, the potential of the plate line PL takes three values:

1. VINT
2. VSS (=0V)
3. VPLL (VINT>VPLL>VSS)

[Standby State]

In the standby state, signals STBY and STBY' change to "HIGH" level, and both the potentials of the plate lines PL and /PL are controlled to the potential VPLL.

[Active State (Read/Restore Operation)]

Assume that the plate line PL is selected, and the plate line /PL is not selected.

The signals STBY and STBY' change to "LOW" level, and the potentials of the plate lines PL and /PL are controlled by signals PLL, PLL', /PLH, and /PLH'.

The signal PLL maintains "LOW" level, and the signal /PLH changes from "HIGH" level to "LOW" level. The potential of the selected plate line PL is controlled to the potential VINT.

On the other hand, the signal PLL' changes from "LOW" level to "HIGH" level, and the signal /PLH' maintains "HIGH" level. The potential of the unselected plate line /PL is controlled to the potential VSS.

In the latter half of read/restore operation, the signal PLL changes from "LOW" level to "HIGH" level, and the signal /PLH changes from "LOW" level to "HIGH" level. The potential of the selected plate line PL is controlled to the potential VSS. During this operation, the potential of the unselected plate line /PL is controlled to remain at the potential VSS.

After read/restore operation, the signals PLL, /PLH, PLL', and /PLH' change to "LOW", "HIGH", "LOW", and "HIGH", respectively. The signals STBY and STBY' change to "HIGH" level to return to the standby state.

(Second Embodiment)

In the second embodiment, a timer circuit is added to the semiconductor integrated circuit device according to the first embodiment. Operation of reducing the potential difference between the two terminals of the capacitor of an unselected memory cell, e.g., adjusting the two terminals to the same potential is performed in accordance with the chip activation time.

Figure 8:
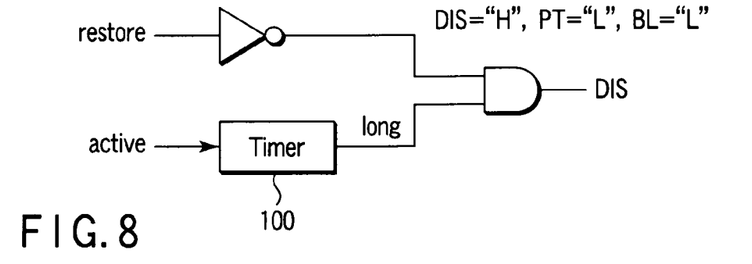
FIG. 8 is a circuit diagram showing a circuit example of the discharge control circuit of a semiconductor integrated circuit device according to the second embodiment of the present invention.

FIG. 8 is a circuit diagram showing a circuit example of the discharge control circuit of a semiconductor integrated circuit device according to the second embodiment of the present invention.

The control circuit according to the circuit example shown in FIG. 8 discharges bit lines BL and /BL when an activation signal "active" is supplied for a long time, similar to the first embodiment.

When the chip is activated, the activation signal "active" is activated to, e.g., "HIGH" level. When activation ends and the circuit shifts to restore operation, a restore signal "restore" is activated to, e.g., "HIGH" level. The activation signal "active" is input to a timer circuit 100. The timer circuit 100 delays the activation signal "active", and outputs it as a signal "long". In this circuit example, if the restore signal "restore" is inactive for a time equal to or longer than the delay time of the timer circuit 100 after the activation signal "active" is activated, a signal DIS is activated. In response to activation of the signal DIS, the control signal PT described in the first embodiment changes to "LOW" level, the control signal EQ changes to "HIGH" level, and the bit lines BL and /BL are discharged.

Figure 9:
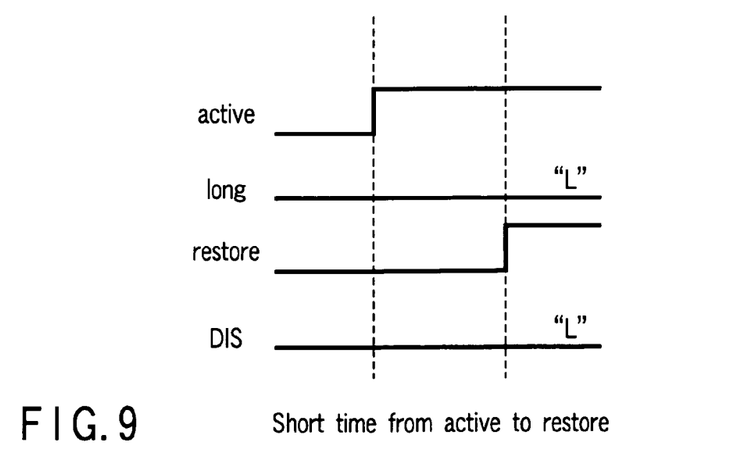
FIG. 9 is an operation waveform chart showing an operation example of the discharge control circuit.
Figure 10:
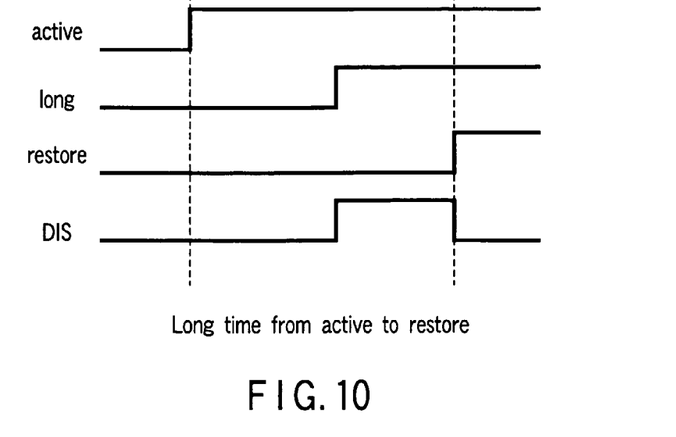
FIG. 10 is an operation waveform chart showing another operation example of the discharge control circuit.
Figure 11:
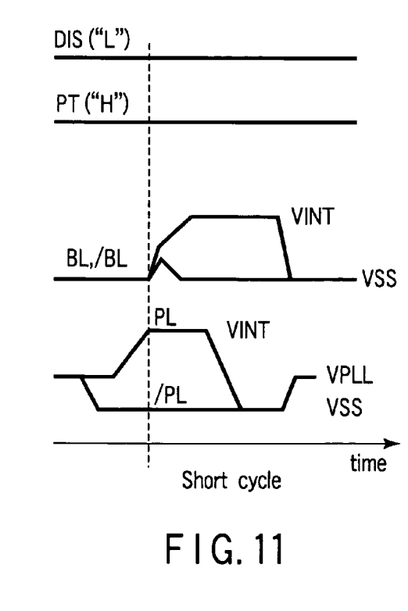
FIG. 11 is an operation waveform chart showing an operation example of the semiconductor integrated circuit device according to the second embodiment of the present invention.

Operation waveforms shown in FIGS. 9 and 11 represent a case wherein the time until the restore signal "restore" is activated after the activation signal "active" is activated is relatively short. Operation waveforms shown in FIGS. 10 and 12 represent a case wherein the time is relatively long.

When the time is short, the signal DIS is not activated, the control signal PT maintains "HIGH" level, and the bit lines BL and /BL are not discharged, as shown in FIGS. 9 and 11.

Figure 12:
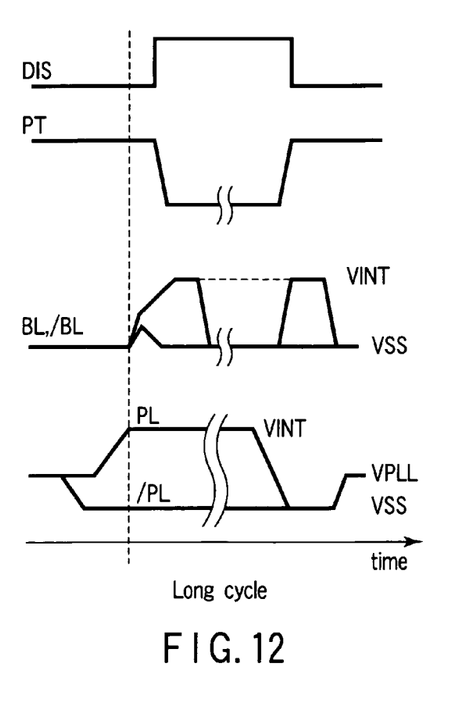
FIG. 12 is an operation waveform chart showing another operation example of the semiconductor integrated circuit device according to the second embodiment of the present invention.

To the contrary, when the time is long, the signal DIS is activated, the control signal PT changes from "HIGH" level to "LOW" level, the control signal EQ (not shown) changes to "HIGH" level, and the bit lines BL and /BL are discharged, as shown in FIGS. 10 and 12. If the restore signal "restore" is activated, the signal DIS is inactivated, and the control signal PT changes from "LOW" level to "HIGH" level. Data is transferred again from the sense amplifier S/A described in the first embodiment to the bit lines BL and /BL. For example, data "1" is restored in the capacitor of a selected memory cell.

In the second embodiment, the reference time for switching whether to activate the signal DIS is determined by the delay time of the timer circuit 100. The reference time can be determined uniquely for each chip or memory cell array in accordance with the device characteristic such as the leakage current (e.g., subthreshold leakage current) of a transistor, the chip operation frequency, and the like. The reference time is appropriately 1 µsec to 100 µsec.

(Third Embodiment)

Figure 13:
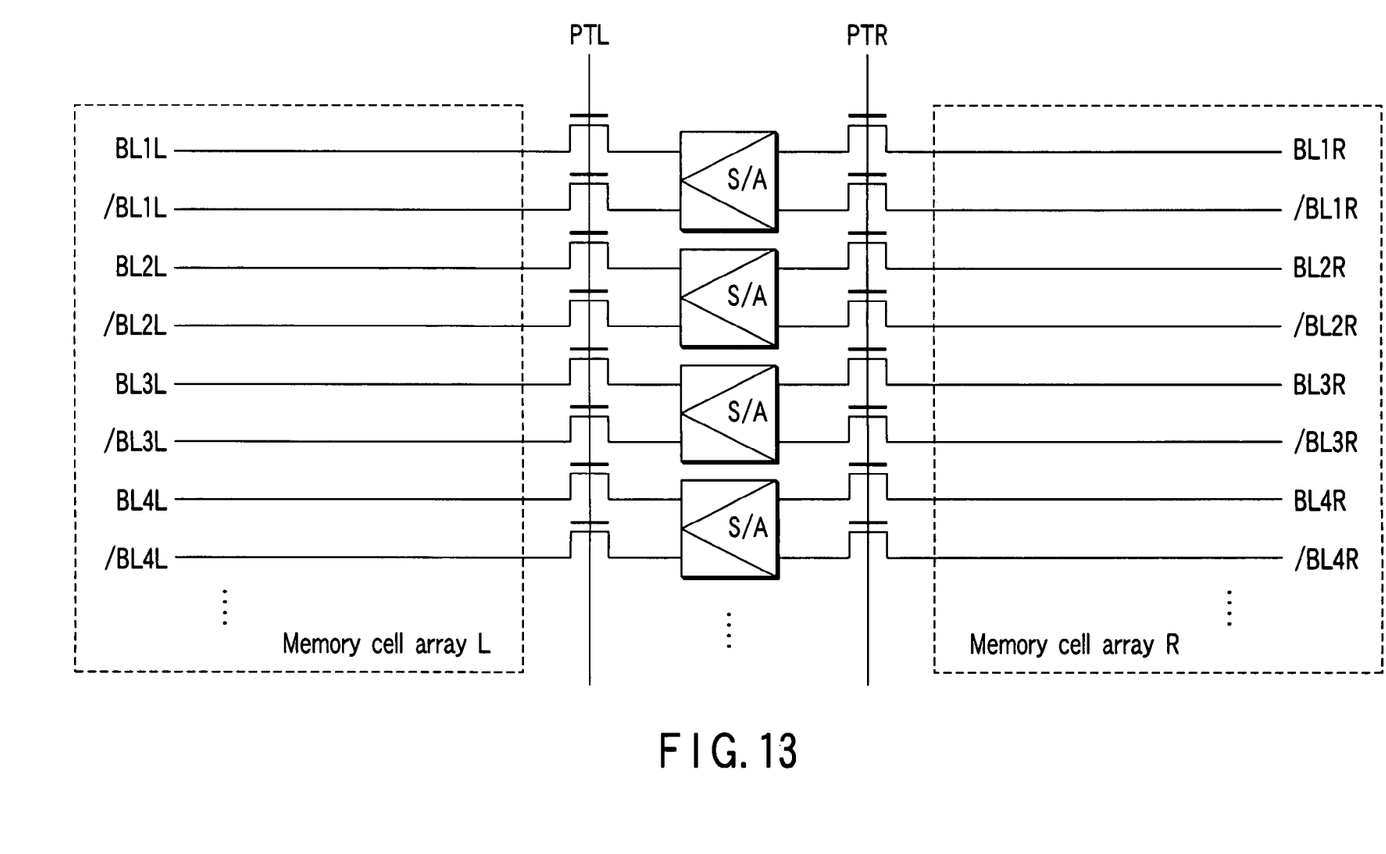
FIG. 13 is a circuit diagram showing a circuit example of a semiconductor integrated circuit device according to the third embodiment of the present invention.

FIG. 13 is a circuit diagram showing a circuit example of a semiconductor integrated circuit device according to the third embodiment of the present invention.

The third embodiment is an application of the memory cell array according to the first embodiment. The third embodiment concerns a shared sense amplifier system in which a sense amplifier is shared between a memory cell array L arranged at one terminal, e.g., the left side of the sense amplifier, and a memory cell array R arranged at the other terminal, e.g., the right side of the sense amplifier.

As shown in FIG. 13, in the third embodiment, the transistor in the first embodiment which is controlled by the control signal PT for disconnecting the bit line BL and sense amplifier S/A is also used as a selection transistor which controls which of the memory cell arrays R and L is to be connected to the sense amplifier S/A.

Figure 14:
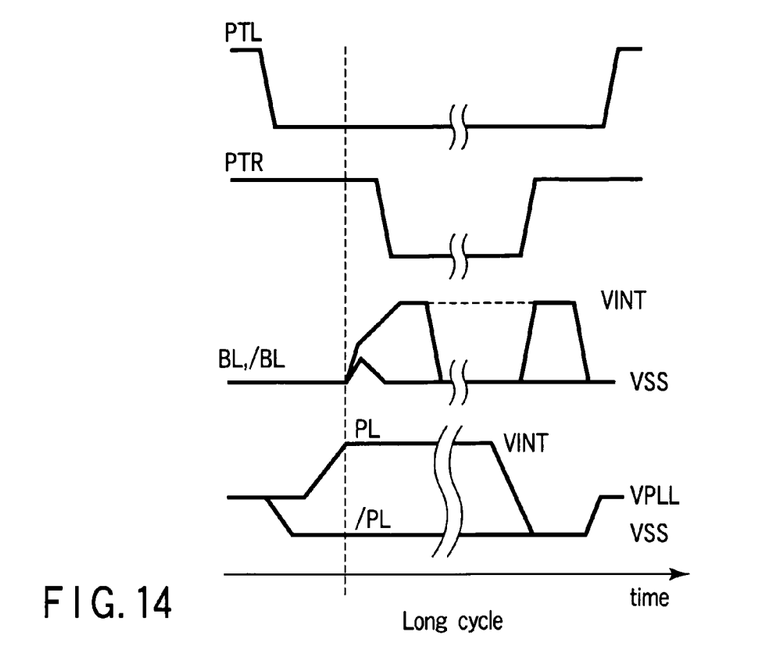
FIG. 14 is an operation waveform chart showing an operation example of the semiconductor integrated circuit device according to the third embodiment of the present invention.
Figure 15:
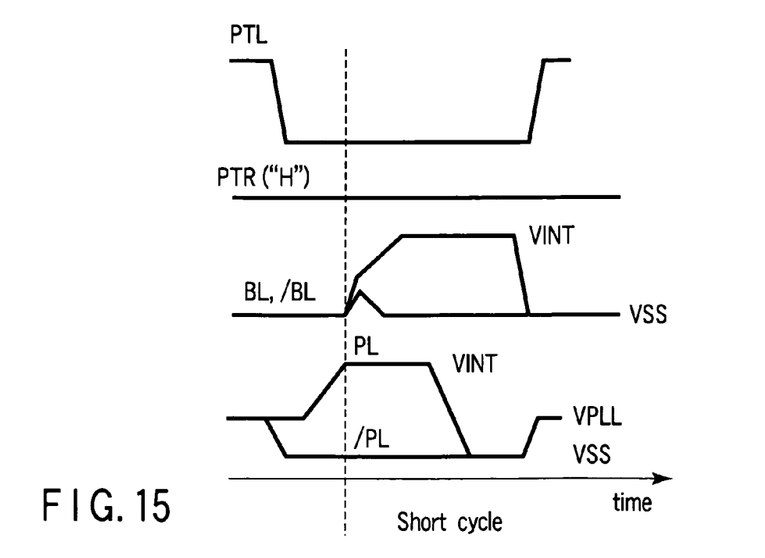
FIG. 15 is an operation waveform chart showing another operation example of the semiconductor integrated circuit device according to the third embodiment of the present invention.

FIGS. 14 and 15 are operation waveform charts showing an operation example of the semiconductor integrated circuit device according to the third embodiment. FIGS. 14 and 15 show a case wherein a memory cell belonging to the memory cell array R is accessed. When access starts, a control signal PTL for connecting bit lines BLL and /BLL (BL1L to BL4L . . . , /BL1L to /BL4L . . . ) of the memory cell array L to sense amplifiers S/A changes to "LOW" level, and the memory cell array L is disconnected from the sense amplifiers S/A. For a long activation time (long cycle), a control signal PTR for connecting bit lines BLR and /BLR (BL1R to BL4R . . . , /BL1R to /BL4R . . . ) of the memory cell array R to the sense amplifiers S/A changes to "LOW" level on the basis of the signal DIS described in the second embodiment (FIG. 14). For a short activation time (short cycle), the control signal PTR maintains "HIGH" level (FIG. 15).

The third embodiment is not always controlled in accordance with the second embodiment, and may be controlled in accordance with the first embodiment.

(Fourth Embodiment)

Figure 16:
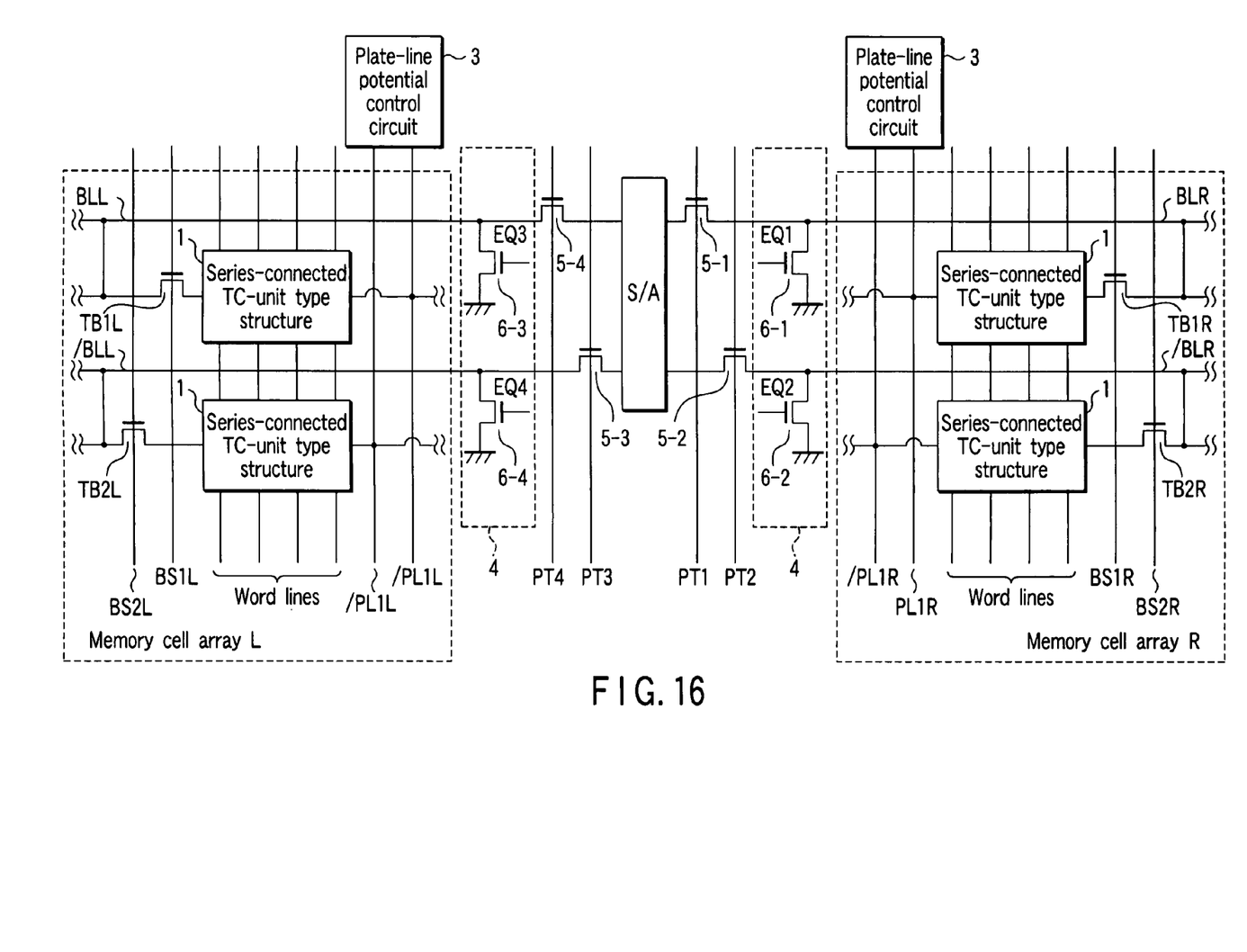
FIG. 16 is a block diagram showing an arrangement example of a semiconductor integrated circuit device according to the fourth embodiment of the present invention.
Figure 17:
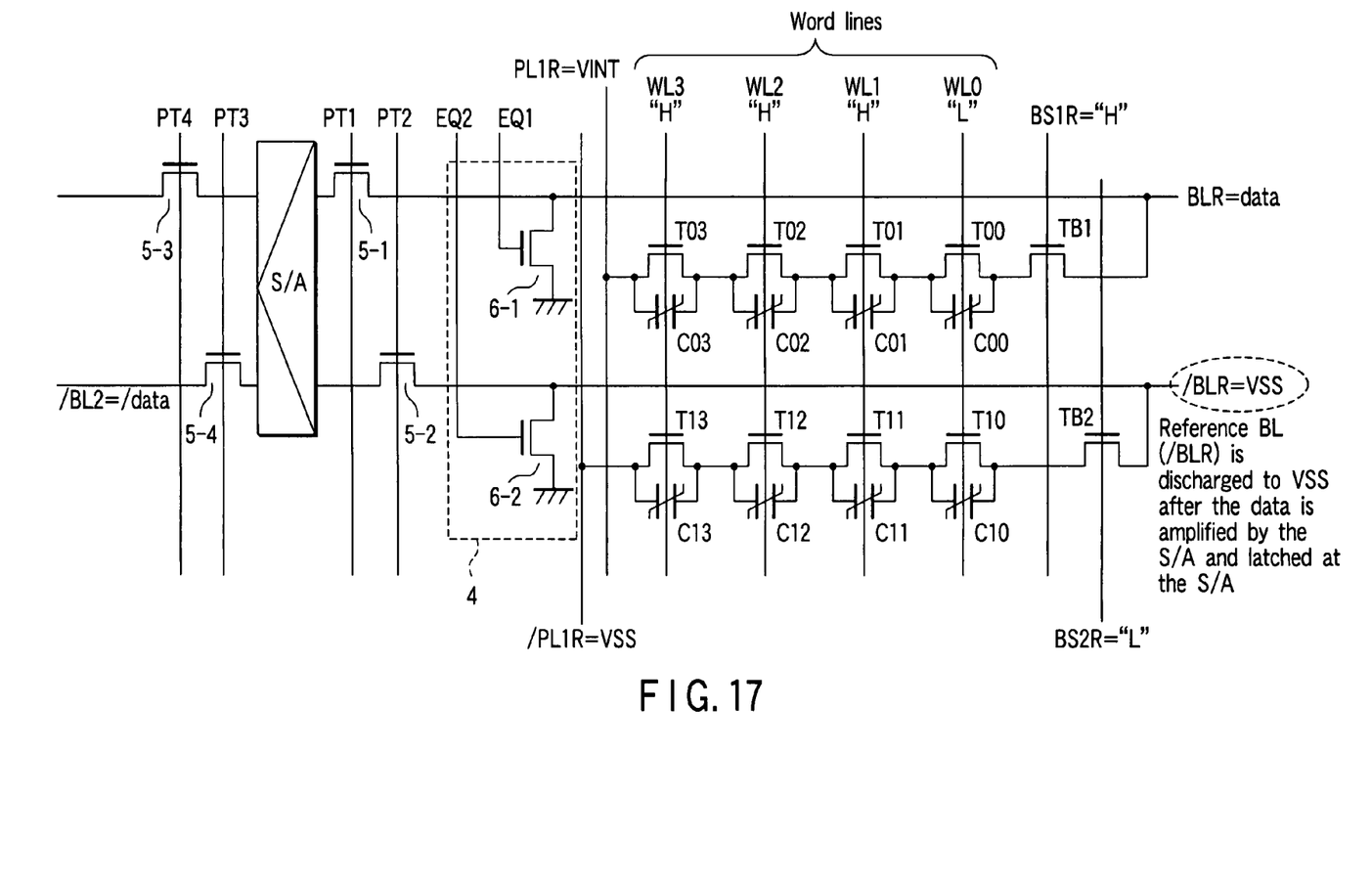
FIG. 17 is a circuit diagram showing a circuit example of the semiconductor integrated circuit device according to the fourth embodiment of the present invention.
Figure 18:
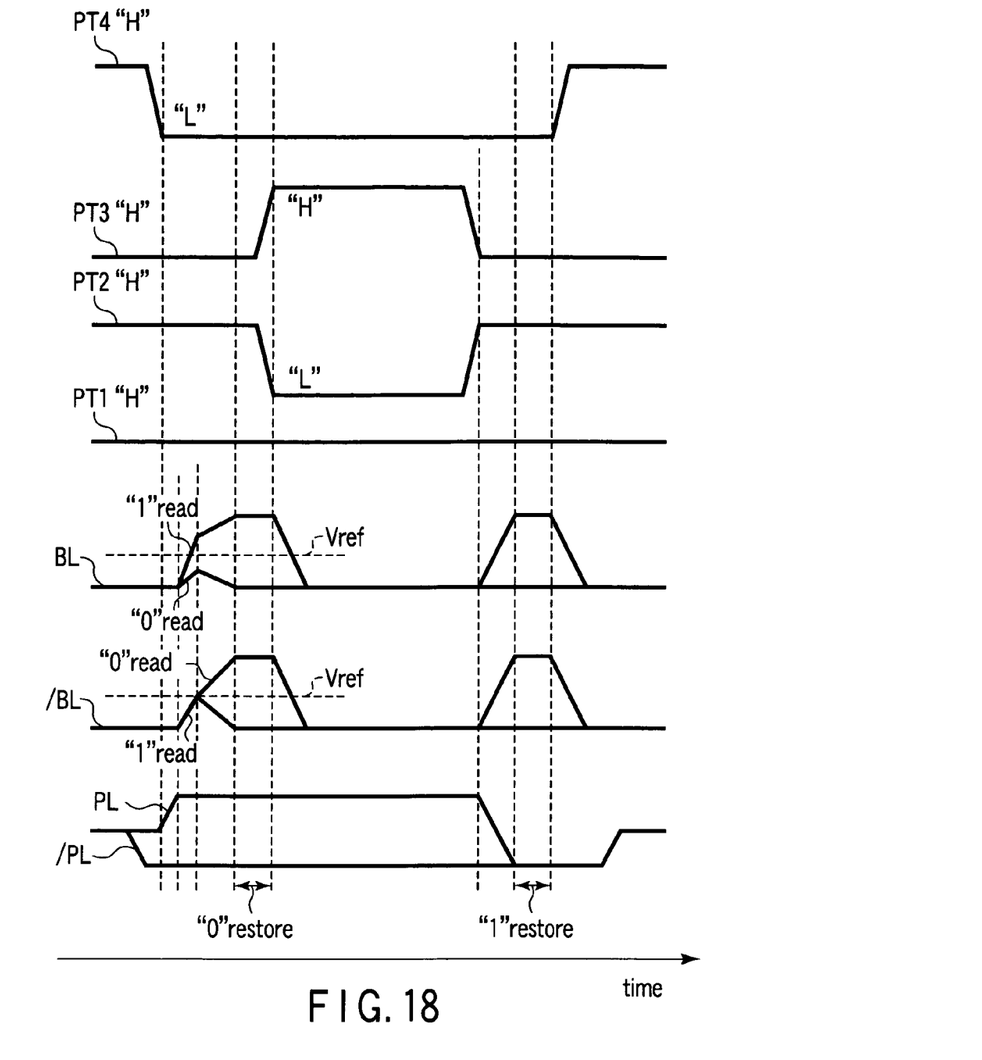
FIG. 18 is an operation waveform chart showing an operation example of the semiconductor integrated circuit device according to the fourth embodiment of the present invention.

FIG. 16 is a block diagram showing an arrangement example of a semiconductor integrated circuit device according to the fourth embodiment of the present invention. FIG. 17 is a circuit diagram showing a circuit example of the semiconductor integrated circuit device. FIG. 18 is an operation waveform chart showing an operation example of the semiconductor integrated circuit device.

Similar to the third embodiment, the fourth embodiment adopts a shared sense amplifier system. Also in the fourth embodiment, similar to the first embodiment, the potential of a plate line /PL1R connected to a capacitor C10 of an unselected memory cell connected to a selected word line WL0 is discharged not to VPLL, but to VSS, e.g., 0V. Although not shown in FIG. 17, the potential of a plate line connected to a memory cell which is not connected to a selected word line maintains, e.g., VPLL. Data of an accessed memory cell C00 is transferred to a bit line BLR, and the potential difference between the bit line BLR and a complementary bit line /BLR is amplified by a sense amplifier S/A. After that, unlike the first embodiment, only the potential of the complementary bit line /BLR is discharged to VSS, e.g., 0V. A transistor 5-2 which connects the complementary bit line /BLR and sense amplifier S/A is turned off by a control signal PT2. In order to keep the same capacitance on a pair of bit lines connected to the sense amplifier S/A, a control signal PT3 is activated to turn on a transistor 5-4, and a bit line /BLL on the opposite side via the sense amplifier S/A is connected to the sense amplifier S/A.

Also in the fourth embodiment, similar to the first embodiment, data destruction by long-time activation of a chip hardly occurs in the capacitor of an unselected memory cell.

In the fourth embodiment, in order to discharge the bit line /BLR to VSS, the transistor 5-3 is turned on when the transistor 5-2 is turned off. While one terminal of the sense amplifier S/A is connected to the bit line BLR, the other terminal of the sense amplifier S/A is connected to the bit line /BLL, instead of the bit line /BLR. The advantage with this structure is that the capacitance added to one terminal of the sense amplifier S/A can be set almost equal to that added to the other terminal. If the capacitance added to one terminal of the sense amplifier S/A and that added to the other terminal are unbalanced, an increase in the speed of sense operation is inhibited. For example, when read data latched by the sense amplifier S/A must be inverted, unbalanced capacitances at the two terminals make data inversion difficult, inhibiting an increase in the speed of sense operation.

However, according to the fourth embodiment, the capacitance added to one terminal of the sense amplifier S/A and that added to the other terminal can be made almost equal. This is advantageous to increasing the speed of sense operation of the sense amplifier S/A.

The embodiments of the present invention can provide a semiconductor integrated circuit device having a ferroelectric memory capable of suppressing data destruction even if a chip is activated for a long time, and an operation method for the semiconductor integrated circuit device.

The present invention has been described in accordance with the first to fourth embodiments. The present invention is not limited to these embodiments, and can be variously modified without departing from the spirit and scope of the invention in practicing the invention.

The ferroelectric memory according to the first to fourth embodiments is expected to be widely applied to a mobile device (e.g., a cell phone), a personal information card, and the like.

The ferroelectric memory is not used singly, but can also be applied to logic-embedded devices and the like.

The advantage of the present invention is that data degradation of an unselected memory cell can be prevented even if the ferroelectric memory is continuously activated for 10 µsec or more. This advantage facilitates the design of the overall system including the ferroelectric memory. Thus, the ferroelectric memory is optimal for application on a logic-embedded device and the like.

In a logic-embedded device, the timing of a logic circuit is controlled by an external clock in many cases. The cycle of one clock is 1 µsec or more in an application field such as a card product using a relatively low frequency band, e.g., an application field using a band of 1 MHz or less. In such a product, a ferroelectric memory cannot be continuously activated for, e.g., 10 clocks or more in terms of prevention of data degradation. The ferroelectric memory must be periodically controlled to be inactive. However, in the use of the ferroelectric memory according to the first to fourth embodiments for a logic-embedded device, data degradation of an unselected memory cell can be suppressed even if the ferroelectric memory is kept activated for a virtually unlimited length of time. The ferroelectric memory need not be periodically inactivated, realizing simple control, low power consumption, and a high calculation efficiency of the logic portion.

The above embodiments can be singly practiced or properly combined.

The above embodiments include inventions on various stages, and inventions on various stages can be extracted by an appropriate combination of building components disclosed in the embodiments.

The above embodiments have described an example of applying the present invention to a ferroelectric memory. The present invention also includes a semiconductor integrated circuit device such as a processor or system LSI which incorporates the above-mentioned ferroelectric memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device includes a series connected TC unit type ferroelectric RAM which includes series connected memory cells each having a transistor having a source terminal and a drain terminal and a ferroelectric capacitor inbetween the two terminals, the device comprising:
    first and second bit lines;
    first and second plate lines;
    a first series connected TC unit type structure which includes series connected memory cells, and has one terminal connected to the first bit line via a first selection transistor and the other terminal connected to the first plate line;
    a second series connected TC unit type structure which includes series connected memory cells, and has one terminal connected to the second bit line via a second selection transistor and the other terminal connected to the second plate line;
    word lines connected to gates of the series connected memory cells included in the first series connected TC unit type structure and gates of the series connected memory cells included in the second series connected TC unit type structure;
    a plate line potential control circuit which controls, in a standby state, potentials of the first and second plate lines to a first potential and, in an active state, the potential of the first plate line from the first potential to a second potential and the potential of the second plate line from the first potential to a third potential when one of the series connected memory cells included in the first series connected TC unit type structure is selected; and
    a bit line potential control circuit which controls a potential of the second bit line to the third potential, after charges are transferred from one of the ferroelectric capacitor included in the first series connected TC unit type structure to the first bit line.

2. The device according to claim 1, wherein the plate line potential control circuit controls the potential of the first plate line from the second potential to the third potential, after controlled to the second potential.

3. The device according to claim 1, wherein plate lines except the first and second plate lines maintain the first potential in the active state.

4. The device according to claim 1, wherein the bit line potential control circuit controls a potential of the first bit line to the third potential, after charges are transferred from one of the ferroelectric capacitor included in the first series connected TC unit type structure to the first bit line.

5. The device according to claim 1, further comprising:
    an amplifier which uses the charges transferred to the first bit line as a signal and the second bit line as a complementary bit line, and amplifies the signal.

6. The device according to claim 5, further comprising:
    a switch which electrically disconnects the amplifier from the first and second bit lines.

7. The device according to claim 6, wherein the switch electrically disconnects the amplifier from the second bit line when the potential of the second bit line is controlled to the third potential.

8. The device according to claim 6, wherein the switch electrically disconnects the amplifier from the first and second bit lines when the potential of the second bit line is controlled to the third potential.

9. The device according to claim 5, further comprising:
    a third bit line; and
    a fourth bit line, wherein the amplifier is shared among the first and second bit lines and third and fourth bit lines.

10. The device according to claim 9, wherein the third and fourth bit lines are arranged in a memory cell array different from a memory cell array in which the first and second bit lines are arranged.

11. The device according to claim 10, wherein the first and third bit lines are electrically connected to one terminal of the amplifier, and the second and fourth bit lines are electrically connected to the other terminal of the amplifier.

12. The device according to claim 11, further comprising;
    a switch which electrically connects and disconnects the amplifier from the first, second, third and fourth bit lines.

13. The device according to claim 12, wherein the switch electrically disconnects the second bit line from the amplifier and electrically connects the fourth bit line to the amplifier after charges are transferred from one of the ferroelectric capacitor included in the first series connected TC unit type structure to the first bit line.

14. The device according to claim 1, wherein the third potential is 0V.

15. An operation method for a semiconductor integrated circuit device includes a series connected TC unit type ferroelectric RAM which includes series connected memory cells each having a transistor having a source terminal and a drain terminal and a ferroelectric capacitor inbetween the two terminals, the device comprises,
    first and second bit lines,
    first and second plate lines,
    a first series connected TC unit type structure which includes series connected memory cells, and has one terminal connected to the first bit line via a first selection transistor and the other terminal connected to the first plate line, a second series connected TC unit type structure which includes series connected memory cells, and has one terminal connected to the second bit line via a second selection transistor and the other terminal connected to the second plate line, and word lines connected to gates of the series connected memory cells included in the first series connected TC unit type structure and gates of the series connected memory cells included in the second series connected TC unit type structure, the operation method comprising:

controlling, in a standby state, potentials of the first and second plate lines to a first potential;

controlling, in an active state, the potential of the first plate line from the first potential to a second potential and the potential of the second plate line from the first potential to a third potential when one of the series connected memory cells included in the first series connected TC unit type structure is selected; and controlling a potential of the second bit line to the third potential, after charges are transferred from one of the ferroelectric capacitor included in the first series connected TC unit type structure to the first bit line.

16. The operation method according to claim 15, wherein the potential of the first plate line is controlled from the second potential to the third potential, after controlled to the second potential.

17. The operation method according to claim 15, wherein the device has third and fourth bit lines which are arranged in a memory cell array different from a memory cell array in which the first and second bit lines are arranged, and an amplifier shared among the first and second bit lines and third and fourth bit lines, and the operation method further comprises, electrically disconnecting the second bit line from the amplifier, and electrically connecting the fourth bit line to the amplifier after charges are transferred from one of the ferroelectric capacitor included in the first series connected TC unit type structure to the first bit line.

18. The operation method according to claim 15, wherein the third potential is 0V.

* * * * *